United States Patent [19]

Dorri

[11] Patent Number: 5,760,585
[45] Date of Patent: *Jun. 2, 1998

[54] METHOD FOR ACTIVELY AND PASSIVELY SHIMMING A MAGNET

[75] Inventor: Bizhan Dorri, Clifton Park, N.Y.

[73] Assignee: General Electric Company, Schenectady, N.Y.

[*] Notice: The term of this patent shall not extend beyond the expiration date of Pat. No. 5,006,804.

[21] Appl. No.: 694,655

[22] Filed: Aug. 7, 1996

[51] Int. Cl.⁶ ............................................. G01R 33/20
[52] U.S. Cl. ............................................. 324/320
[58] Field of Search ........................... 324/300, 318, 324/320

[56] References Cited

U.S. PATENT DOCUMENTS 5,006,804  4/1991  Dorri et al. ...................... 324/320
5,045,794  9/1991  Dorri et al. ...................... 324/320

*Primary Examiner*—Sandra L. O'Shea
*Assistant Examiner*—Michael Eisenberg
*Attorney, Agent, or Firm*—Douglas E. Erickson; Marvin Snyder

[57] ABSTRACT

A method for actively and passively shimming a magnet having a magnetic field inhomogeneity, correction coils, and shim locations. The magnetic field is measured, and the inhomogeneity determined. The magnetic field created by a known current in each correction coil and by a known shim at each shim location is determined. Using linear programming, the optimum currents and shim sizes together are determined which minimizes the inhomogeneity plus the total currents used plus the total shim sizes used.

4 Claims, 1 Drawing Sheet

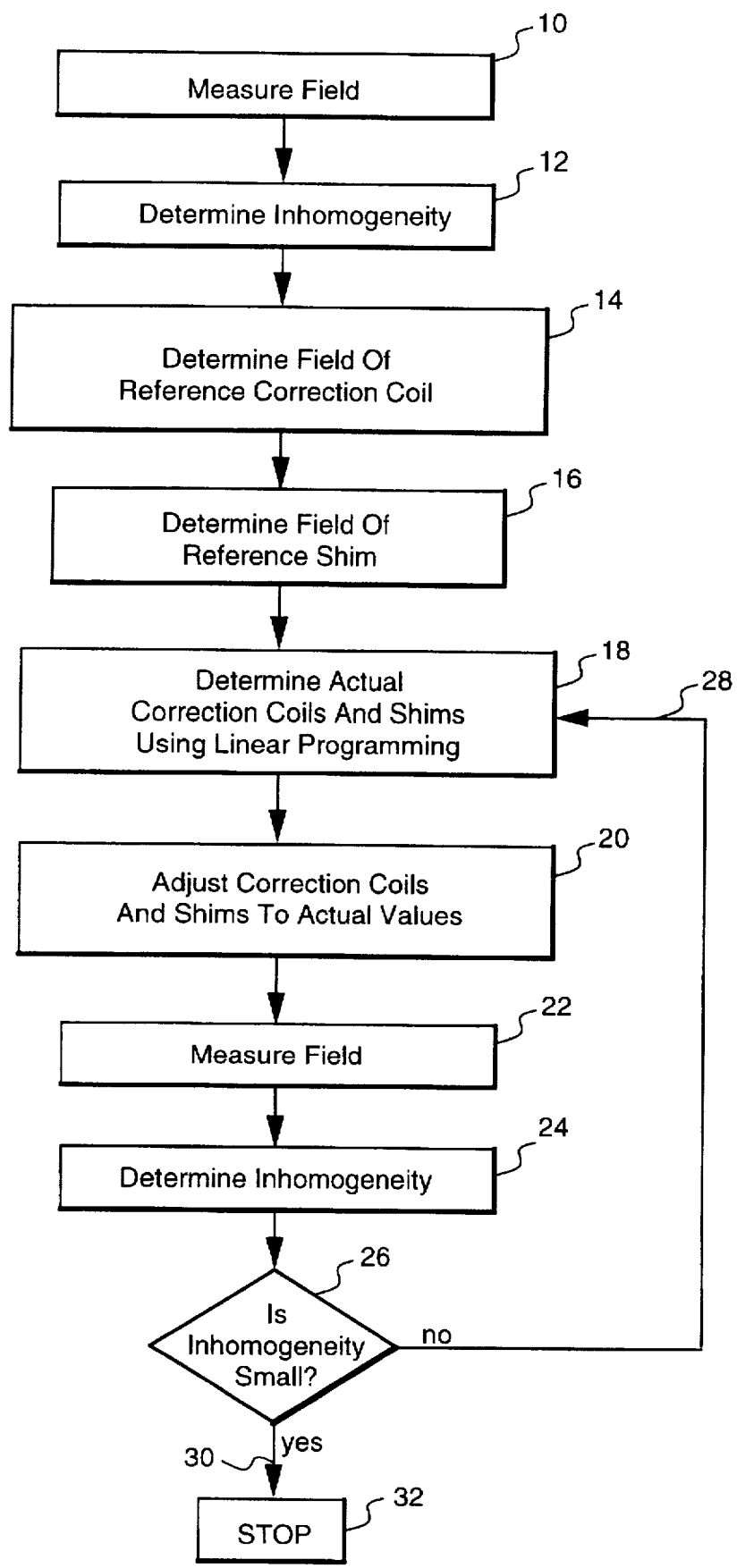

METHOD FOR ACTIVELY AND PASSIVELY SHIMMING A MAGNET

BACKGROUND OF THE INVENTION

The present invention relates generally to magnets, and more particularly to actively and passively shimming a magnet.

Magnets include those which rely on electric current in wound coils to produce a magnetic field. Examples of such magnets include open and closed MRI (magnetic resonance imaging) superconductive magnets which are designed to produce a uniform magnetic field within an imaging volume.

Closed MRI superconductive magnets have a single superconductive coil assembly with a bore in which is located the imaging volume. Open MRI superconductive magnets have two spaced-apart superconductive coil assemblies with generally coaxially aligned bores and an imaging volume located in the open space between the superconductive coil assemblies. Open magnets have advantages in certain applications such as in MRI (magnetic resonance imaging) medical imaging where the open space helps the patient overcome any feelings of claustrophobia that may be experienced in a closed magnet design. Real open and closed magnets have an inhomogeneity of the magnetic field in the imaging volume due to manufacturing tolerances and site conditions. In many applications, the open or closed magnet must be shimmed to reduce the inhomogeneity of the magnetic field in the imaging volume to within a predetermined specification. For example, an open or closed MRI superconductive magnet must be shimmed to reduce the inhomogeneity of the magnetic field in its imaging volume to within a few parts per million for use in medical diagnosis.

Known methods for shimming high-field (e.g., 1.0 or 1.5 Tesla) magnets, such as open or closed MRI superconductive magnets, and especially those which also have hard-to-align superconductive shielding coils, include active shimming and passive shimming. Active shimming typically requires a complex arrangement of (typically superconductive) correction coils (also called shimming coils). An example of a method for active shimming, which uses a linear programming computer code, is disclosed in U.S. Pat. No. 5,006,804 entitled "Method Of Optimizing Shim Coil Current Selection In Magnetic Resonance Magnets", by Dorri et al., which issued Apr. 9, 1991. Passive shimming typically involves the placement of carbon steel shims of calculated thickness in the bore of the superconductive coil assembly at calculated locations on the inside diameter of the superconductive coil assembly. An example of a method for passive shimming, which uses a linear programming computer code, is disclosed in U.S. Pat. No. 5,045,794 entitled "Method Of Optimizing Passive Shim Placement In Magnetic Resonance Magnets", by Dorri et al., which issued Sep. 3, 1991. It also is known to actively and passively shim a magnet by first iteratively applying the active shimming method of previously-cited U.S. Pat. No. 5,006,804; then iteratively applying the passive shimming method of previously-cited U.S. Pat. No. 5,045,794; then iteratively reapplying the active shimming method; then iteratively reapplying the passive shimming method, etc., until the magnetic field inhomogeneity within the imaging volume is minimized. The iterative (i.e., repetitive) nature of any shimming process is the result of the computer shim code being only an approximation of the real magnet.

What is needed is an improved method for shimming a magnet to even lower levels of inhomogeneity with even fewer shimming iterations.

SUMMARY OF THE INVENTION

It is an object of the invention to provide a method for actively and passively shimming a magnet.

The method of the invention is for shimming a magnet having correction coils, shim locations, and a central bore. The method includes the following steps. In step (a), the magnetic field is measured in the central bore of the magnet at predetermined points. In step (b), the magnetic field inhomogeneity is determined from the measured magnetic field. In step (c), the magnetic field created by a known current in each correction coil operating alone is determined at each of the predetermined points. In step (d), the magnetic field created alone from each shim location by a single shim of known size is determined at each of the predetermined points. In step (e), the current for each correction coil and the shim size at each shim location is determined using a linear programming solver to minimize, in the same step, the magnetic field inhomogeneity plus the total correction coil currents used plus the total shim sizes used, with the correction coil currents and the shim sizes being determined based on the measured magnetic field and on the magnetic fields determined in steps (c) and (d), with the correction coil currents each constrained to a maximum value, and with the shim sizes each constrained to a maximum value. In step (f), the currents in the correction coils and the shim sizes at the shim locations are adjusted to those determined in step (e). In step (g), after step (f) the magnetic field is measured in the central bore of the magnet at the predetermined points. In step (h), the magnetic field inhomogeneity is determined from the measured magnetic field. In step (i), the magnetic field inhomogeneity is compared to a desired value. In step (j), steps (e), (f), (g), (h), and (i) are repeated until the magnetic field inhomogeneity is generally within the desired value.

Several benefits and advantages are derived from the invention. Applicant has performed shimming experiments on several magnets and have found that, in comparison to sequentially applying the shimming methods of U.S. Pat. No. 5,006,804 and U.S. Pat. No. 5,045, 794, Applicant's shimming method reduced the magnetic field inhomogeneity by generally ten percent, cut the number of shimming iterations generally in half, and used ten to twenty percent less total correction coil current and shim size.

BRIEF DESCRIPTION OF THE DRAWING

The accompanying drawing illustrates a preferred embodiment of the present invention wherein:

The FIGURE is a block diagram (flow chart) of a preferred method of the present invention for actively and passively shimming a magnet.

DETAILED DESCRIPTION OF THE INVENTION

Referring now to the drawing, FIG. 1 shows in block diagram form a first preferred method of the invention for actively and passively shimming a magnet having correction coils (i.e., coils, for active shimming, which are sometimes called shimming coils), shim locations (i.e., locations, for passive shimming, which may contain, for example, carbon steel shims) and a central bore. U.S. Pat. No. 5,006,804 entitled "Method Of Optimizing Shim Coil Current Selection In Magnetic Resonance Magnets", by Dorri et al., which issued Apr. 9, 1991, is hereby incorporated by reference, such patent disclosing a magnet and a method for actively shimming the magnet which uses a linear programming computer code to determine the current for each correction coil (i.e., shimming) coil. U.S. Pat. No. 5,045,794 entitled "Method Of Optimizing Passive Shim Placement In Magnetic Resonance Magnets", by Dorri et al., which issued Sep. 3, 1991, is hereby incorporated by reference, such patent disclosing a magnet and a method for passively shimming the magnet which uses a linear programming computer code to determine the shim size at each shim location.

The first preferred method begins with a step portrayed in block 10 of the FIGURE as "Measure Field". This step, hereinafter referred to as step (a), includes measuring (i.e., mapping) the magnetic field in the central bore of the magnet at predetermined points. The magnetic field is measured by measuring the magnetic field strength. In an exemplary method, there are 314 predetermined points which all lie on the surface of the imaging volume. Preferably, the imaging volume is a spherical imaging volume of an MRI magnet used for medical diagnosis and medical procedures which requires a very low (e.g., within generally ten parts-per-million global peak-to-peak) magnetic field inhomogeneity within its imaging volume for sharp medical images. It is known that if the magnetic field inhomogeneity is within a desired value on the surface of the imaging volume, it will be within the desired value within the imaging volume.

Another step is portrayed in block 12 of the FIGURE as "Determine Inhomogeneity". This step, hereinafter referred to as step (b), includes determining the magnetic field inhomogeneity from the measured magnetic field measured in step (a). Preferably, the magnetic field inhomogeneity is determined in terms of the global peak-to-peak magnetic field inhomogeneity. For example, the global peak-to-peak magnetic field inhomogeneity is the difference between the highest measured magnetic field and the lowest measured magnetic field determined from the 314 magnetic field measurements taken at the previously-described 314 predetermined points.

A further step is portrayed in block 14 of the FIGURE as "Determine Field of Reference Correction Coil". This step, hereinafter referred to as step (c), includes determining, at each of the predetermined points, the magnetic field created by a known electric current (e.g., one ampere) in each correction coil operating alone. Step (c), which can precede steps (a) and (b), can be done once and used in all magnets of the same design or can be redone for every magnet to be shimmed. Such determination can be performed, for example, by actual experiment or by computer simulation. In an exemplary method, there are 18 correction coils.

An additional step is portrayed in block 16 of the FIGURE as "Determine Field Of Reference Shim". This step, hereinafter referred to as step (d), includes determining, at each of the predetermined points, the magnetic field created alone from each shim location by a single shim of known size (e.g., a carbon-steel rectangular solid having a length of 7 inches, a width of 1 inch, and a thickness of 0.1 inch). Step (d), which can precede steps (a) and (b), and even step (c), can be done once and used in all magnets of the same design or can be redone for every magnet to be shimmed. Such determination can be performed, for example, by actual experiment or by computer simulation. In an exemplary method, there are 300 shim locations.

Another step is portrayed in block 18 of the FIGURE as "Determine Actual Correction Coils and Shims Using Linear Programming". This step, hereinafter referred to as step (e), includes determining, in the same step, the electric current for each correction coil and the shim size at each shim location using a linear programming solver to minimize the magnetic field inhomogeneity plus the total correction coil currents used plus the total shim sizes used, with the correction coil currents and the shim sizes being determined based on the measured magnetic field and on the magnetic fields determined in steps (c) and (d), with the correction coil currents each constrained to a maximum value, and with the shim sizes each constrained to a maximum value. Preferably, step (e) further comprises changing the importance of minimizing the currents used in the correction coils and the shim sizes used at the shim locations relative to the importance of minimizing the magnetic field inhomogeneity, with smaller measured magnetic field inhomogeneity increasing the weight given minimizing the currents used in the correction coils and the shim sizes used at the shim locations. In an exemplary method, each shim size has an identical length equal to the length of the single shim of known size of step (d), an identical width equal to the width of the single shim of known size of step (d), and a thickness, and wherein step (e) includes determining the thickness.

Step (e) can be mathematically portrayed as:

$$\text{MINIMIZE} \sum_{i=1}^{2N} aI_i + \sum_{k=1}^{L} bX_k + T \quad (1)$$

Subject to:

$$\sum_{i=1}^{N} \delta B_{i,j} I_i - \sum_{i=1}^{N} \delta B_{i,j} I_{N+i} + \sum_{k=1}^{L} \delta b_{k,j} X_k + BM_j - BMEAN \leq T/2 + E/2 \quad (2)$$

for $j = 1$ to $M$ $$\sum_{i=1}^{N} \delta B_{i,j} I_i - \sum_{i=1}^{N} \delta B_{i,j} I_{N+i} + \sum_{k=1}^{L} \delta b_{k,j} X_k + BM_j - BMEAN \geq -T/2 - E/2 \quad (3)$$

for $j = 1$ to $M$ $$I_i \leq I_m \quad (4)$$

for $i = 1$ to $2N$ $$X_k \leq X_m \quad (5)$$

for $k = 1$ to $L$ where: M is the total number of predetermined points; N is the total number of correction coils; L is the total number of shim locations; $I_i$ is the electric current for shim coil i or i-N (the first N values represent positive currents and the last N values represent negative currents); $X_k$ is the thickness of the shim size (having a standard composition, length, and width) at shim location k; a and b are weighting factors, E is the desired value of the global peak-to-peak magnetic field inhomogeneity, T is the amount of the global peak-to-peak magnetic field inhomogeneity over the desired value E; $\delta B_{i,j}$ is the change in the magnetic field strength at predetermined point j caused by passing one ampere current in shim coil i; $\delta b_{k,j}$ is the change in the magnetic field strength at predetermined point j caused by placing a one-mils (i.e., one-thousandth of an inch) thick shim size (having the standard composition, length, and width) in shim location k; $BM_j$ is the strength of the magnetic field measured at predetermined point j; BMEAN is the mean value (i.e., one-half the highest magnetic field strength plus one-half the lowest magnetic field strength) of the magnetic field measured at the M predetermined points; $I_m$ is the maximum current that can be supplied to the correction coils; and $X_m$ is the maximum thickness shim size (having the standard composition, length, and width) that can be placed at the shim locations. It is noted that $I_i$, $X_k$, T, and BMEAN are unknown variables. The non-negativity constraint is an inherent part of the linear programming formulation.

Preferably, the above equations are solved using the linear programming algorithm which is disclosed in U.S. Pat. No. 5,006,804 and U.S. Pat. No. 5,045,794 previously incorporated herein by reference. With the previously-mentioned and preferred 18 correction coils, 300 shim locations, and 314 predetermined points, the linear programming problem has 338 variables and 964 constraints. With reference to the two incorporated patents, and as can be appreciated by those skilled in the art, a close examination of the formulation of equations 1-5 suggests that both phase I and phase II of the linear programming problem need to be solved. This is due to the fact that some of the constraints, when expressed in "less than or equal to" form, have a negative right hand side of the equation. If the linear programming problem of equations 1-5 were described in dual form, the resulting problem will have 964 variables and 338 constraints, and only the phase II problem needs to be solved. Therefore, the formulation of equations 1-5 preferably is reformed into its dual problem, and the dual solution of the dual problem will represent the original primal solution. Many methods exist for solving this linear programming problem, namely the simplex, revised simplex, dual simplex, and Karmarkar's methods. A close look at these methods by Applicant has identified the revised simplex method as an efficient way for solving this linear programming problem. This is due to the fact that many computations during pivoting operations can be reduced for the vertically symmetric coefficient matrix, as can be appreciated by those skilled in the art. Also, computer storage can be reduced by having to store only half of the coefficient matrix.

A further step is portrayed in block 20 of the FIGURE as "Adjust Correction Coils And Shims To Actual Values". This step, hereinafter referred to as step (f), includes adjusting the currents in the correction coils and the shim sizes at the shim locations to those determined in step (e). It is noted that a "zero" value for a current for a particular correction coil determined in step (e) means that no current would be applied to that correction coil in step (f). Likewise, a "zero" value for a shim thickness for a particular shim location determined in step (e) means that no shim would be placed at that shim location in step (f).

An additional step is portrayed in block 22 of the FIGURE as "Measure Field". This step, hereinafter referred to as step (g), includes measuring, after step (f), the magnetic field in the central bore of the magnet at the predetermined points. It is seen that step (g) is the same as step (a).

Another step is portrayed in block 24 of the FIGURE as "Determine Inhomogeneity". This step, hereinafter referred to as step (h), includes determining the magnetic field inhomogeneity from the measured magnetic field measured in step (g). It is seen that step (h) is the same as step (b).

A further step is portrayed in block 26 of the FIGURE as the question "Is Inhomogeneity Small?". This step, hereinafter referred to as step (i), includes comparing the magnetic field inhomogeneity to a desired value. The desired value is the "E" term found in Equations 2 and 3 which are part of the mathematical formulation associated with step (e). From experience, it is recommended to choose "E" to be, for example "7 ppm"(parts-per-million) in the mathematical equations in order to achieve an inhomogeneity of 10 ppm in the actual magnet because the mathematical equations can only be an approximation to the actual magnetic field.

An additional step is portrayed by arrows 28 and 30 and block 32 in the FIGURE. Arrow 28, which is used when the question in block 26 is answered "no", leads back to block 18. Arrow 30, which is used when the question in block 26 is answered "yes", leads forward to block 32 which is entitled "Stop". This step, hereinafter referred to as step (j), includes repeating steps (e), (f), (g), (h), and (i) until the magnetic field inhomogeneity is generally within the desired value. The desired value is the term "E" previously discussed. It is noted that, when the magnetic field inhomogeneity is measured in terms of the global peak-to-peak magnetic field inhomogeneity, then the global peak-to-peak magnetic field inhomogeneity is minimized when the currents in the correction coils and the shim sizes at the shim locations are determined.

As previously mentioned, Applicant has performed shimming experiments on several magnets and has found that, in comparison to sequentially applying the shimming methods of U.S. Pat. No. 5,006,804 and U.S. Pat. No. 5,045, 794, Applicant's shimming method reduced the magnetic field inhomogeneity by generally ten percent, cut the number of shimming iterations generally in half, and used ten to twenty percent less total correction coil current and shim size. It is noted that Applicant's method is a hybrid shimming method in which the active (i.e., correction coils) and passive (i.e., shims) shimming is done in the same iteration so that the electric currents for the correction coils and the shim sizes at the shim locations are optimized together.

The foregoing description of a preferred embodiment of the invention has been presented for purposes of illustration. It is not intended to be exhaustive or to limit the invention to the precise form disclosed, and obviously many modifications and variations are possible in light of the above teaching. It is intended that the scope of the invention be defined by the claims appended hereto.

I claim:

1. A method for shimming a magnet having correction coils, shim locations, and a central bore, comprising the steps of:
   (a) measuring the magnetic field in the central bore of the magnet at predetermined points;
   (b) determining the magnetic field inhomogeneity from the measured magnetic field;
   (c) determining, at each of the predetermined points, the magnetic field created by a known current in each correction coil operating alone;
   (d) determining, at each of the predetermined points, the magnetic field created alone from each shim location by a single shim of known size;
   (e) determining, in the same step, the current for each correction coil and the shim size at each shim location using a linear programming solver to minimize the magnetic field inhomogeneity plus the total correction coil currents used plus the total shim sizes used, with the correction coil currents and the shim sizes being determined based on the measured magnetic field and on the magnetic fields determined in steps (c) and (d), with the correction coil currents each constrained to a maximum value, and with the shim sizes each constrained to a maximum value;
   (f) adjusting the currents in the correction coils and the shim sizes at the shim locations to those determined in step (e);
   (g) measuring, after step (f), the magnetic field in the central bore of the magnet at the predetermined points;
   (h) determining the magnetic field inhomogeneity from the measured magnetic field;
   (i) comparing the magnetic field inhomogeneity to a desired value; and
   (j) repeating steps (e), (f), (g), (h), and (i) until the magnetic field inhomogeneity is generally within the desired value.

2. The method of claim 1, wherein step (e) further comprises changing the importance of minimizing the currents used in the correction coils and the shim sizes used at the shim locations relative to the importance of minimizing the magnetic field inhomogeneity, with smaller measured magnetic field inhomogeneity increasing the weight given minimizing the currents used in the correction coils and the shim sizes used at the shim locations.

3. The method of claim 1, wherein the magnetic field inhomogeneity is measured in terms of the global peak-to-peak magnetic field inhomogeneity, and the global peak-to-peak magnetic field inhomogeneity is minimized when the currents in the correction coils and the shim sizes at the shim locations are determined.

4. The method of claim 1, wherein each shim size has an identical length, an identical width, and a thickness, and wherein determining the shim size in step (e) includes determining the thickness.

* * * * *